(12) United States Patent
Ielmini et al.

(10) Patent No.: US 11,314,843 B2
(45) Date of Patent: Apr. 26, 2022

(54) MATHEMATICAL PROBLEM SOLVING CIRCUIT COMPRISING RESISTIVE ELEMENTS

(71) Applicant: POLITECNICO DI MILANO, Milan (IT)

(72) Inventors: Daniele Ielmini, Milan (IT); Zhong Sun, Milan (IT); Giacomo Pedretti, Milan (IT)

(*) Notice: Subject to any disclaimer, the term of this patent is extended or adjusted under 35 U.S.C. 154(b) by 107 days.

(21) Appl. No.: 16/650,883

(22) PCT Filed: Sep. 27, 2018

(86) PCT No.: PCT/IB2018/057487
§ 371 (c)(1),
(2) Date: Mar. 26, 2020

(87) PCT Pub. No.: WO2019/064215
PCT Pub. Date: Apr. 4, 2019

(65) Prior Publication Data
US 2020/0233922 A1    Jul. 23, 2020

(30) Foreign Application Priority Data
Sep. 27, 2017    (IT) ..................... 102017000108281

(51) Int. Cl.
*G06F 17/16* (2006.01)
*G06F 9/50* (2006.01)
(Continued)

(52) U.S. Cl.
CPC ............ *G06F 17/16* (2013.01); *G06F 9/5027* (2013.01); *G06F 17/12* (2013.01); *G11C 13/0021* (2013.01)

(58) Field of Classification Search
CPC ........ G06F 17/16; G06F 9/5027; G06F 17/12; G06F 7/34; G11C 2213/77; G11C 13/0002
(Continued)

(56) References Cited

U.S. PATENT DOCUMENTS 9,910,827 B2 *    3/2018   Muralimanohar ...... G06F 17/16
10,459,724 B2 *   10/2019  Yu ......................... G06F 9/30025
(Continued)

FOREIGN PATENT DOCUMENTS

CN    102789811 B    2/2015
WO    2016/064406 A1  4/2016
(Continued)

OTHER PUBLICATIONS

International Search Report and Written Opinion issued in corresponding International App. No. PCT/I B2018/057487, dated Jan. 4, 20219, 15 pages.
(Continued)

*Primary Examiner* — Tan V Mai
(74) *Attorney, Agent, or Firm* — Verrill Dana, LLP; Robert L. Hover

(57) ABSTRACT

It is described a mathematical solving circuit (100) comprising: a crosspoint matrix ($M_G$) including a plurality of row conductors ($L_i$), a plurality of column conductors ($C_j$) and a plurality of analog resistive memories (Gij), each connected between a row conductor and a column conductor; a plurality of operational amplifiers ($OA_i$) each having: a first input terminal ($IN_{1i}$) connected to a respective row conductor ($L_i$), a second input terminal ($IN_{2i}$) connected to a ground terminal (GR) at least one operational amplifier ($OA_i$) of the plurality being such to take the respective first input terminal ($IN_{1i}$) to a virtual ground.

15 Claims, 10 Drawing Sheets

(51) Int. Cl.
 *G06F 17/12* (2006.01)
 *G11C 13/00* (2006.01)
(58) Field of Classification Search
 USPC .......................................................... 708/200
 See application file for complete search history.

(56) References Cited

U.S. PATENT DOCUMENTS

| | | | |
|---|---|---|---|
| 10,621,267 B2* | 4/2020 | Strachan | H01L 27/2463 |
| 10,664,271 B2* | 5/2020 | Muralimanohar | G06F 17/16 |
| 10,878,317 B2* | 12/2020 | Hatcher | G06F 7/4806 |
| 2017/0040054 A1* | 2/2017 | Friedman | G11C 13/0002 |

FOREIGN PATENT DOCUMENTS

| | | | | |
|---|---|---|---|---|
| WO | 2017/026989 A1 | 2/2017 | | |
| WO | 2017/052598 A1 | 3/2017 | | |
| WO | WO-2017052598 A1 * | 3/2017 | ......... | G11C 13/0069 |
| WO | 2017/142542 A1 | 8/2017 | | |

OTHER PUBLICATIONS

Merkel Cory et al: "Neuromemristive Systems: Boosting Efficiency through Brain-Inspired Computing", Computer, IEEE Computer Society, USA, vol. 49, No. 10, Oct. 2016 (Oct. 2016), pp. 56-64, XP011626047, ISSN: 0018-9162, DOI: 10.1109/MC.2016.312 [retrieved on Oct. 18, 2016].

* cited by examiner

MATHEMATICAL PROBLEM SOLVING CIRCUIT COMPRISING RESISTIVE ELEMENTS

CROSS-REFERENCE TO RELATED APPLICATIONS

The present application is a United States National Stage of International Application No. PCT/IB2018/057487, filed Sep. 27, 2018, which claims priority to Italian Patent Application No. 102017000108281, filed on Sep. 27, 2017, the entire contents of both applications are incorporated in the present application by reference.

TECHNICAL FIELD

The present invention refers to the field of mathematical calculations performed by electronic circuits employing resistive elements.

STATE OF THE ART

Resistive memories frequently find an application in mathematical calculation electronic circuits. With reference to this matter, document U.S. Pat. No. 9,152,827 describes a circuit provided with resistive memories organized in a crosspoint matrix and structured for performing a matrix-vector product operation of the type x=Ab, wherein x is a current vector, A is a conductance matrix, and b is a vector of voltages applied to each row of the crosspoint matrix.

Document US-A-2017/0040054 describes matrixes of resistive memories for computational accelerators, particularly for solving systems of equations and by resorting to iterative numeral techniques. It is observed that such solution requires several iteration to obtain the convergence.

An approach analogous to the one disclosed in document US-A-2017-0040054 is found in "Mixed-Precision Memcomputing", M. Le Gallo et al., arXiv:1701.04279 [cs.ET] which faces the problem of solving linear systems by an iterative approach (Krylov subspaces) by combining matrixes of phase changing memories for a mixed precision solution.

SUMMARY OF THE INVENTION

The Applicant has observed that the computational methods of the prior art exhibit limitations both in relation to the type of executable computational operations (i.e., simple multiplications) and in terms of computational load, with reference to the possibility of solving algebraical problems.

A first object of the invention is a mathematical problem solving circuit as described in independent claim 1. Particular embodiments are described in dependent claims from 2 to 15.

BRIEF DESCRIPTION OF THE DRAWINGS

The invention will be described in the following with reference to non-limiting examples given only in an illustrative way in the following drawings.

These drawings show different aspects and embodiments of the present invention and, when appropriate, similar structures, components, materials and/or elements in the different figures are indicated by the same reference numbers.

DETAILED DESCRIPTION OF THE INVENTION

Figure 1:
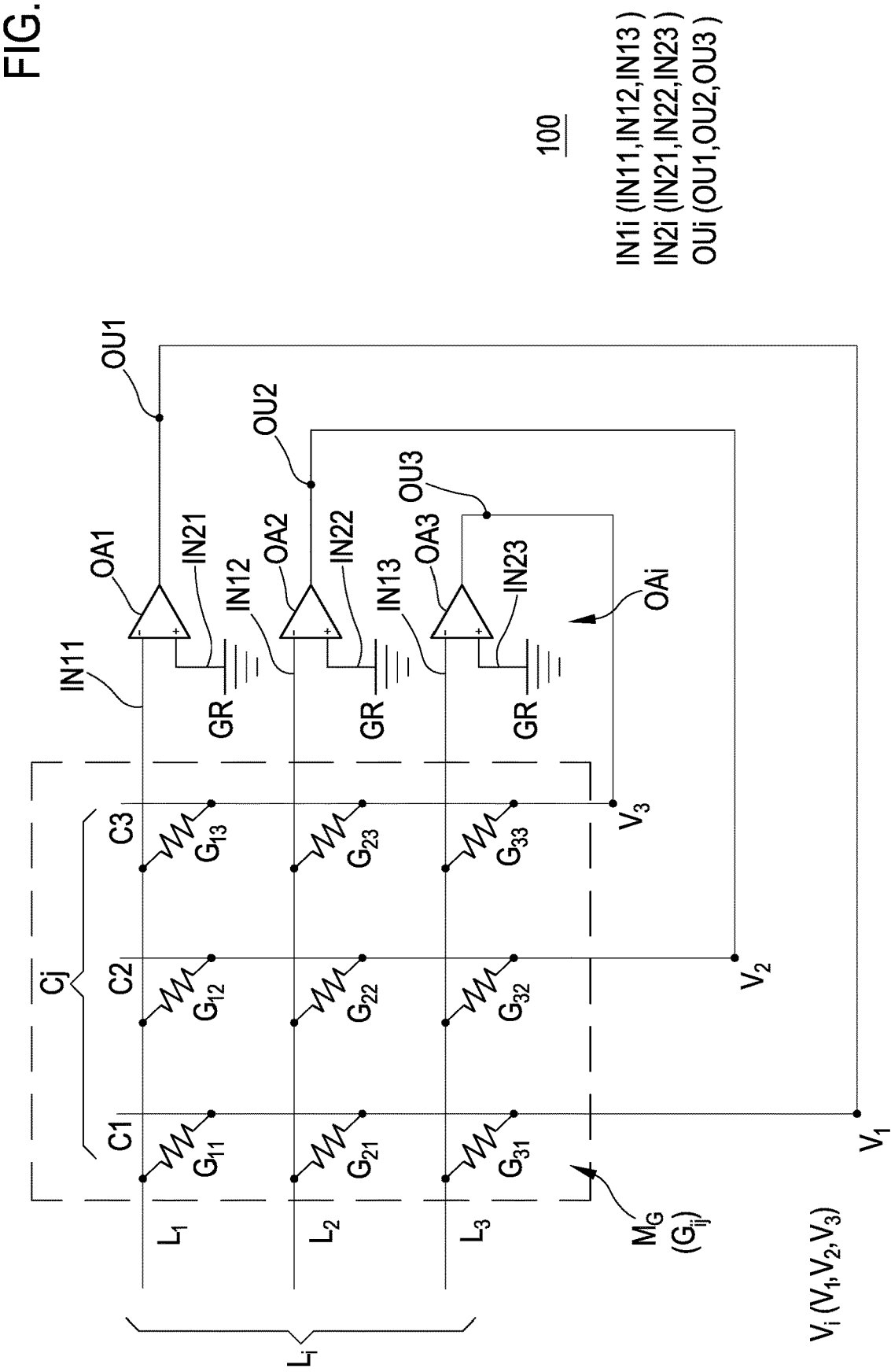
FIG. 1 shows an example of a mathematical problem solving circuit.

While the invention is susceptible to different modifications and alternative constructions, some respective illustrated embodiments are shown in the drawings and will be described specifically in the following. Anyway, it is stated that there is no intention to limit the invention to the particular illustrated embodiment, on the contrary, the invention intends to cover all the modifications, alternative constructions, and equivalents falling in the scope of the invention as defined in the claims.

FIG. 1 refers to an example of a circuit for solving mathematical problems 100. The solving circuit 100 comprises a crosspoint matrix $M_G$ including a plurality of row conductors Li, a plurality of column conductors Cj, and a plurality of analog resistive memories $G_{ij}$ each connected between a respective row conductor Li and a respective column conductor Cj.

For the purpose of the present invention, a resistive memory (also known as memristor) is a circuit element with two terminals (in other words a dipole) having a conductance which can be configured for taking a value which is maintained until a possible new configuration is attained. For example, the following devices are resistive memories: the Resistive Random Access Memories (RRAM), the Conductive Bridging Random Access Memories (CBRAM), the Phase Change Memories (PCM), the Magnetoresistive Random Access Memories (MRAM) of different types, the Ferroelectric Random Access Memories (FeRAM) of different types, the organic material memories, or other devices which can change the conductance thereof due to electric, magnetic fields, thermal, optical, mechanical operations or any other type of operations, or a combination thereof.

The above described resistive memories Gij are preferably of an analog type which means they can take continuous conductance values in an operative range; however, it is not excluded the possibility of resistive memories Gij of the digital type, this means they can take conductance values falling in a finite set of values.

The particular shown example illustrates a number N=3 of row conductors Li, an equal number N=3 of column conductors Cj and a number N×N=3×3 of analog resistive memories represented by their conductance $G_{ij}$.

Moreover, the circuit 100 comprises a plurality of operational amplifiers AOi having a closed-loop configuration, and each having: a first input terminal IN1i connected to a respective row conductor Li, a second input terminal IN2i connected to a ground terminal GR and an output terminal OUi. Particularly, the first input terminal IN1i is the inverting terminal of the respective operational amplifier OAi, while the second input terminal IN2i is the non-inverting terminal of the respective operational amplifier $OA_i$.

The output terminal OUi of each operational amplifier OAi is connected to a respective column Cj. Specifically, according to FIG. 1, each output terminal OUi is connected to an end of a column Cj wherein j=i. FIG. 1, according to the described example, shows three operational amplifiers OAi (OA1, OA2, OA3) and, therefore, three first input terminals IN1i (IN11, IN12, IN13), three second input terminals IN2i (IN21, IN22, IN23), and three output terminals OUi (OU1, OU2, OU3) are shown.

Due to the negative feedback, it is observed that each operational amplifier AOi can operate in order to take the respective first input terminal IN1i to a virtual ground, in other words to take a voltage value near (theoretically equal to) the one of the ground GR assumed by the second input terminal IN2i. It is observed that the virtual ground is theoretically assumed by operational amplifiers having an infinite gain. Particularly, each operational amplifier AOi has an inverting configuration.

With reference to the mathematical problem to be solved, the plurality of resistive memories Gij can be configured for representing, by respective conductance values (again indicated by Gij), a first plurality of known values of the mathematical problem.

Moreover, the circuit 100 enables to detect a plurality of electric magnitudes of the circuit itself, adapted to be configurable to represent a second known value or a second plurality of known values of the mathematical problem to be solved. This second plurality of known values comprise, for example, values of currents injected in each row conductor or the known value can be a conductance (or another parameter) of an additional electric component connectable to the plurality of operational amplifiers AOi.

The plurality of operational amplifiers AOi define a plurality of output voltages Vi (measurable at each output terminal OUi) representative of a plurality of values solving the mathematical problem.

According to particular embodiments, the solving circuit 100 is useable for the approximate solution of problems of linear algebra, among which, are exemplifyingly listed the following:

the solution of a square system of equations, expressible in a matrix form;

the inversion of real square matrixes;

the calculation of eigenvectors.

The solving circuit 100 can further comprise at least one apparatus for measuring voltage values Vi (not shown). Such measuring apparatus can be analog (i.e., a potentiometer) or digital so that a conversion of the voltage values Vi from analog to digital is required.

It is observed that in the present description, identical or analogous circuit components will be indicated by the same identifying symbols in the figures.

Solution of a Square System of Equations

Figure 2:
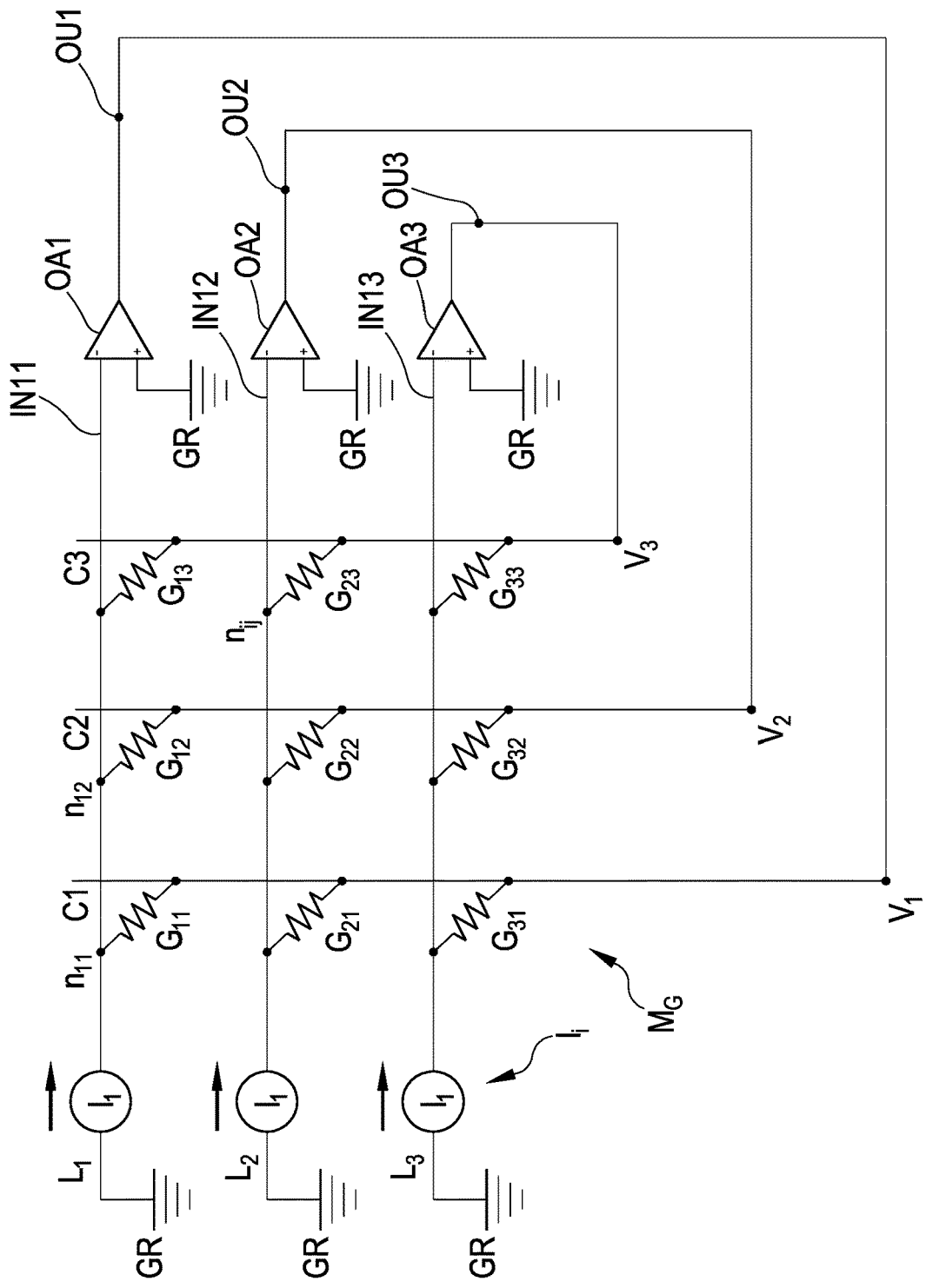
FIG. 2 shows an example of a first circuit for solving square systems of equations.

FIG. 2 refers to a first embodiment of the above described circuit 100 and shows, by an example, a first circuit for solving square systems of equations 200.

The first system solving circuit 200 is capable of solving a square system of equations expressible by the following matrix form:

$$Ax=b \quad (1)$$

wherein:

A: is a matrix of real coefficients having a dimension N×N;

x: is an unknown vector, the length thereof being N;

b: is a vector of real elements, the length thereof being N.

It is observed that the resistive memories Gij can be configured to take a predetermined value (except for an uncertainty margin) inside a range between a minimum value Gmin and a maximum value Gmax.

Each conductance value $G_{ij}$ of a resistive memory of the matrix 1 is equal or proportional to an element $A_{ij}$ of the matrix A. Particularly, the first circuit for solving square systems of equations 200, shown in FIG. 2, refers to elements $A_{ij}$ of the matrix A, which are all positive.

The first system solving circuit 200 is also provided with a plurality of current generators Ii, each connected, for example, to a first end of the row conductors Li. It is observed that each operational amplifier AOi is connected to the respective row conductor Li at, for example, a second end, opposite to the first end connected to the current generator Ii. According to the example, the resistive memories $G_{ij}$ exhibit a respective terminal connected to a corresponding row conductor at a node $n_{ij}$, comprised between the first and second ends of the specific row conductor $L_i$.

The current generators Ii are configured to inject in the respective row conductors, a current Ii ($I_1$, $I_2$, $I_3$), the values thereof are selected so that they are equal or proportional to the elements of the known vector b of the matrix system (1). The currents Ii are constant or pulsed currents.

In the operation, the currents Ii supplying the row conductors $L_i$ flow to the first input terminal INi (in other words the virtual ground terminal IN1i) of each operational amplifier AOi. The electric voltages Vi are evaluated between the respective output terminal OUi and ground GR.

From FIG. 2, it is possible to write the following equations based on the Ohm and Kirchhoff laws:

$$V_1G_{11}+V_2G_{12}+V_3G_{13}=-I_1$$

$$V_1G_{21}+V_2G_{22}+V_3G_{23}=-I_2$$

$$V_1G_{31}+V_2G_{32}+V_3G_{33}=-I_3 \quad (2)$$

The equations (2) can be rewritten in a compact way as in the expression (3):

$$\Sigma j VjGij=-Ii \quad (3)$$

and also, by an algebraic notation, by the following matrix equation (4):

$$AV=-I \quad (4)$$

wherein A is the matrix of the conductances $G_{ij}$, I is the known vector −b and the vector of the voltages V solves the linear system Ax=b, as already expressed by (1).

In the operation, as hereinbefore stated, the values of the conductances $G_{ij}$ are configured and the first circuit 200 is supplied by predetermined current values $I_i$.

The operational amplifiers AOi take the respective first input terminal INi (the inverting terminal) and therefore all the row conductors Li to the ground and consequently the electric voltages Vi, at the output terminals OUi, assume the final values, as expressed by the relationship (4).

It is observed that selecting high gain operational amplifiers OAi, enables to very quickly reach the virtual ground, and the voltages also quickly converge to values Vi to be determined. Particularly, for this embodiment and for other embodiments, operational amplifiers having a nominal gain greater than 105 can be selected.

Measuring the voltage values Vi (specifically $V_1$, $V_2$, and $V_3$), reached in the first system solving circuit 200, enables to obtain elements of the vector x, and consequently to solve the equation system (1).

Figure 3:
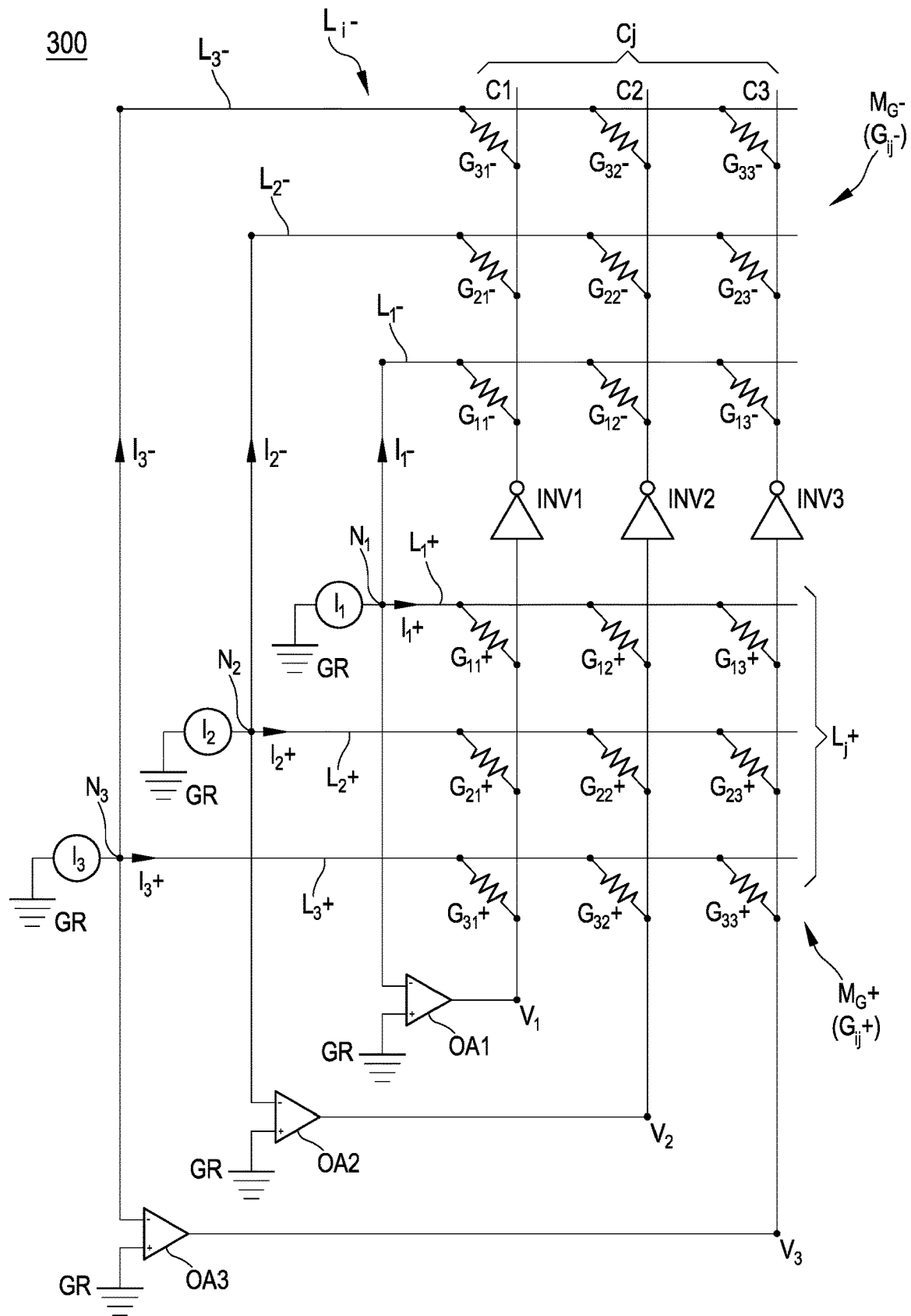
FIG. 3 shows, by an example, a second circuit for solving square systems of equations.

The first system solving circuit 200 of FIG. 2 refers to a matrix of coefficients A containing only positive elements. By considering a matrix of the coefficients $A_1$ containing both positive and negative elements, the solution of the equation systems $$A_1 x = b \qquad (1a)$$

can be obtained by the embodiment in FIG. 3 which shows an example of a second circuit for solving square systems of equations 300, in a specific example wherein the matrix of coefficients $A_1$ has a dimension N=3.

The second system solving circuit 300 is configured by observing that the matrix $A_1$ can be expressed as the difference between a first matrix A+ and a second matrix A−, both containing only positive elements:

$$A_1 = A+ - A- \qquad (5)$$

Particularly, the second matrix A− contains the absolute values of the negative elements of the matrix $A_1$.

According to the expression (5), the second system solving circuit 300 comprises a first crosspoint matrix $M_{G+}$, analogous to the matrix $M_G$ of FIG. 2, the resistive memories thereof have conductances Gij+ corresponding to the elements of the first matrix A+ and a second crosspoint matrix $M_{G-}$ (structurally analogous to the first one), the resistive memories thereof have conductances Gij− corresponding to the elements of the second matrix A−.

The two crosspoint matrixes have the same column conductors Cj, along each of them it is interposed (between a resistive memory Gij+ and a resistive memory Gij−) a respective inverting device Inv1 (in the shown example: Inv1, Inv2, Inv3) configured to invert the sign of the electric voltage from its inlet to its output and corresponding to the difference indicated by relationship (5).

The first crosspoint matrix $M_G+$ comprises N=3 row conductors $L_{i+}$ ($L_{1+}$, $L_{2+}$, $L_{3+}$), each of them has an end connected to a respective supply node $N_i$ ($N_1$, $N_2$, $N_3$) connected to a corresponding current generator $I_i$.

The second crosspoint matrix $M_G-$ of the example comprises N=3 row conductors $L_{i-}$ ($L_{1-}$, $L_{2-}$, $L_{3-}$), each of them has an end connected to one of the supply nodes $N_i$ ($N_1$, $N_2$, $N_3$).

Particularly, the operational amplifiers $OA_i$ of the second system solving circuit 300 operate as hereinbefore described with reference to the virtual ground and have the respective inverting input terminal IN1i connected to each row conductor $L_{i+}$ and $L_{i-}$, particularly, at the supply nodes $N_1$, $N_2$ and $N_3$, which therefore operate as virtual ground nodes.

Each of the known currents ($I_1$, $I_2$ and $I_3$) is split at one of the supply nodes $N_1$, $N_2$ and $N_3$ into two terms, that is $I_{i+}$ and $I_{i-}$:

$$I_i = I_{i+} + I_{i-} \qquad (6)$$

With reference to the first crosspoint matrix $M_G+$, it is valid the equation:

$$\Sigma_j V_j G_{ij+} = -I_{i+} \qquad (7)$$

wherein Vj indicates the voltage vector $V_1$, $V_2$, $V_3$.

With reference to the second crosspoint matrix $M_G-$, it is valid the following equation:

$$-\Sigma_j V_j G_{ij-} = -I_{i-} \qquad (8)$$

By summing to each other the equations (7) and (8), it is obtained:

$$\Sigma_j V_j (G_{ij+} - G_{ij-}) = -I_{i+} - I_{i-} = -I \qquad (9)$$

Based on the relationship (5), it is obtained:

$$(G_{ij+} - G_{ij-}) = (A_+ - A_-) = -A_1 \qquad (10)$$

Therefore, it is possible to rewrite (8) as follows:

$$(A_+ - A_-)x = A_1 x = -I = b \qquad (11)$$

By changing the currents $I_i$ to the values of the known vector b, measuring the voltage Vj enables to solve the system of equations (1a) also for a matrix of coefficients $A_1$, comprising negative and positive elements.

Inverting Square Matrixes

Moreover, it is observed that the problem solving circuit 100, also in the embodiments in FIG. 2 and FIG. 3, can be used for inverting square matrixes, in other words for calculating an inverse matrix $A^{-1}$ of the matrix A.

The inverse matrix $A^{-1}$ meets the relationship:

$$AA^{-1} = U \qquad (12)$$

wherein U is the identity matrix, whose elements are all null, except for the elements of the diagonal which are equal to 1.

It is observed that for determining the inverse matrix $A^{-1}$, it is required to solve the following systems of equations:

$$AA_i^{-1} = U_i \qquad (13)$$

wherein:
$A_i^{-1}$ is the i-th column of the inverse matrix $A^{-1}$,
$U_i$ is the i-th column of the identity matrix U.

If the dimension of matrix A is N×N, it is required to solve N systems according to (13). In this case, the first circuit for solving systems of equations 200 can be configured, with reference to one of the systems of equations (13), so that:
the crosspoint matrix $M_G$ has conductances Gij equal to the values of the matrix A to be inverted;
the currents $I_i$ take the values $U_i$ of the i-th column of the identity matrix U.

Under such conditions, in the same way as indicated with reference to FIG. 2, the values of voltages Vj represent the column $A_i^{-1}$ of the inverse matrix $A^{-1}$.

By using the mode described with reference to FIG. 3, it is possible to invert matrixes containing also negative and positive elements.

Calculating Eigenvectors

Figure 4:
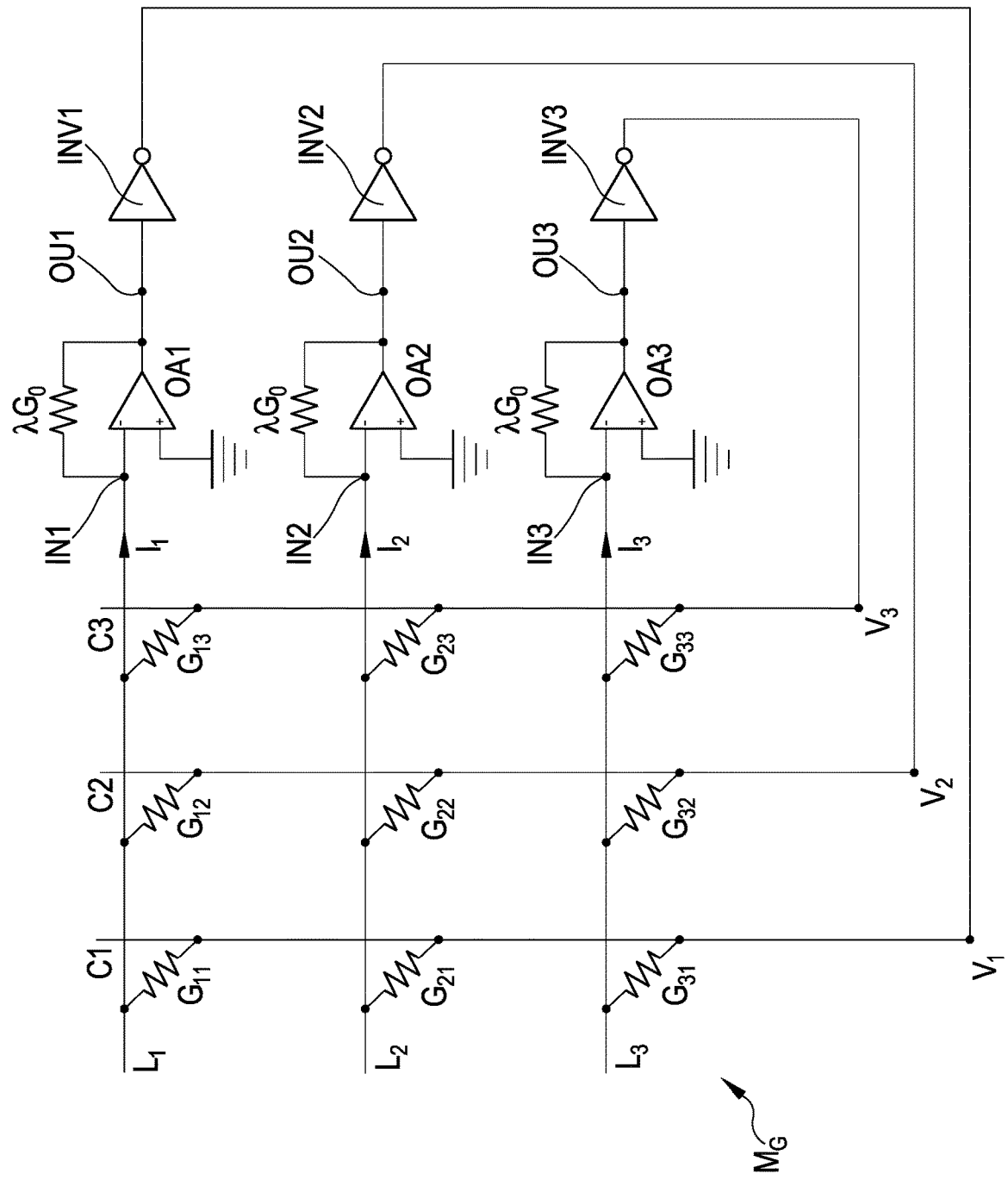
FIG. 4 shows an example of a first circuit for calculating eigenvectors.

As hereinbefore discussed, the circuit 100 can be used for calculating eigenvectors as it is for example shown in FIG. 4 illustrating a first eigenvector calculating circuit 400.

The problem to be solved can be expressed by the relationship:

$$Ax = \lambda x \qquad (14)$$

wherein:
A is a N×N matrix of known elements;
x is the eigenvector of the matrix A, which is unknown;
λ is the (scalar) eigenvalue of the matrix A, which is known.

In the first eigenvector calculating circuit 400, the operational amplifiers AOi have a trans-impedance configuration and, particularly, the first input terminal IN1i (the inverting one "−") is connected to the output terminal OUi of each operational amplifier OAi by a respective feedback resistor having conductance equal to $\lambda G_0$, wherein $G_0$ is a known value and is a reference conductance.

Particularly, each feedback resistor $\lambda G_0$ (implementable by a resistive memory) is connected between an output terminal OUi and an input node INi (in the example $IN_1$, $IN_2$, $IN_3$) respectively connected to the inverting terminal of each operational amplifier OAi.

The output terminals OUi of the operational amplifiers AOi are connected to the row conductors $L_i$ by respective inverters INV1I, INV2 and INV3 for obtaining the closed-loop configuration.

The example of FIG. 4 refers to the case of N=3 for a matrix A containing only positive elements.

Currents $I_1$, $I_2$ and $I_3$ which flow to the input nodes INi of the respective operational amplifier, can be expressed by:

$$I1=V1G11+V2G12+V3G13$$

$$I2=V1G21+V2G22+V3G23$$

$$I3=V1G31+V2G32+V3G33 \quad (15)$$

For a generic value N, the system (15) can be rewritten in the following way:

$$Ii=\Sigma jVjGij \quad (16)$$

or, by a matrix notation, in the following way:

$$I=GV \quad (17)$$

The vector of the current I is transformed by the operational amplifiers OAi having the trans-impedance configuration into a voltage vector V:

$$V=I/G_{TIA} \quad (18)$$

The transformation expressed by the relationship (18) is enabled by each operational amplifier OAi operating as a trans-impedance amplifier, and by the respective inverter INVi.

Wherein $G_{TIA}$ is the conductance of the feedback resistance:

$$G_{TIA}=\lambda G_0 \quad (19)$$

wherein $\lambda$ is the eigenvalue, and $G_0$ is the reference conductance.

Therefore, it is possible to write:

$$GV=G_0\lambda V \quad (20)$$

The comparison of the latter with the relationship $Ax=\lambda x$, enables to obtain:

$$A=G/G_0, x=V \quad (21)$$

Therefore, in the circuit 400 of FIG. 4, the conductances Gij of the resistive memories of the crosspoint matrix $M_G$ have values equal to the ones of the elements of the matrix A multiplied by the value of the reference conductance $G_0$.

The feedback resistance $G_{TIA}$ is given by the product of the eigenvalue $\lambda$ and of the reference conductance $G_0$. The measured values of the voltages $V_i$ ($V_1$, $V_2$, and $V_3$) correspond to the requested eigenvector x. It is observed that a complete set of eigenvectors x is obtained by modifying the eigenvalue, in other words the value of the feedback resistance $G_{TIA}$.

It is observed that a possible application of the first eigenvector calculating circuit 400 is found in the link matrixes of the ranking algorithms (for example, for Google), wherein the eigenvalue expresses the importance score of each page. Therefore, the described solution seems extremely advantageous for accelerating the ranking of Internet pages and generally for analyzing "big data".

The first eigenvector calculating circuit 400 can be also applied for an approximate numeral solution of differential equations. When a differential equation is transformed in a finite difference equation, it has again the matrix form $Ax=\lambda x$. For example, the Schrödinger equation takes such form, wherein A is a semi-diagonal matrix, $\lambda$ is the eigenvalue of the energy, and x is the solution eigenfunction of the problem.

Figure 5:
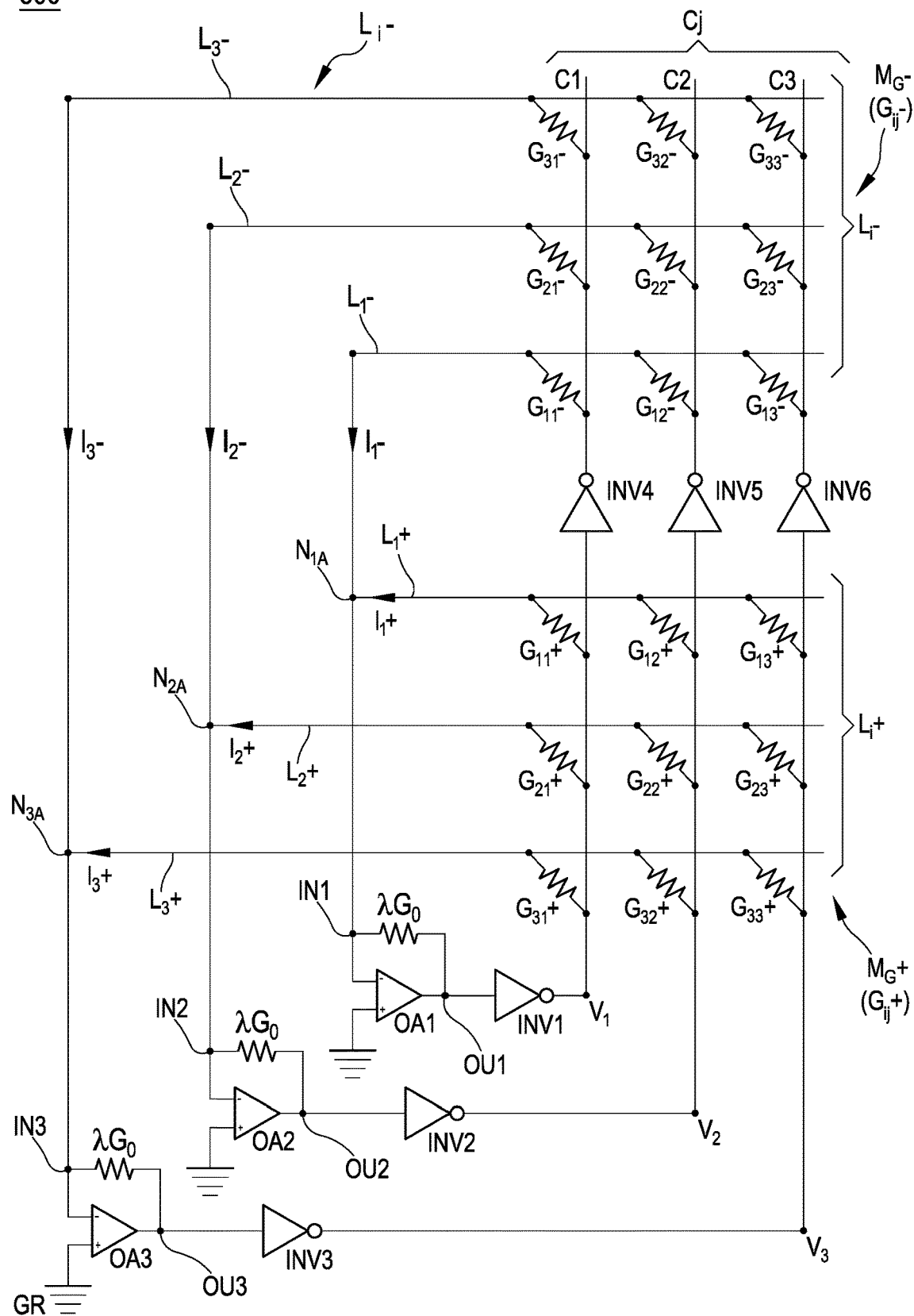
FIG. 5 shows an example of a second circuit for calculating eigenvectors.

If the matrix A, of which the eigenvectors are sought, contains both positive and negative elements, the problem can be solved by the second eigenvector calculating circuit 500 shown, by an example, in FIG. 5 (still for N=3).

The second eigenvector calculating circuit 500 comprises the first crosspoint matrix $M_G+$ and second crosspoint matrix $M_G-$ which respectively correspond to the matrixes G+ and G−, containing positive elements according to the notation:

$$A=(G+-G-)/G_0 \quad (22)$$

The two crosspoint matrixes have the same column conductors Cj, along each of them it is interposed (between a resistive memory Gij+ and a resistive memory Gij−) a respective inverting device Invj (Inv4, Inv5, Inv6) configured to invert the sign of the electric voltage from the input thereof to the output thereof.

The first crosspoint matrix $M_G+$ comprises N=3 row conductors $L_{i+}$ ($L_{1+}$, $L_{2+}$, $L_{3+}$), each of them has an end connected to a respective connecting node $N_{iA}$ ($N_{1A}$, $N_{2A}$, $N_{3A}$). The second crosspoint matrix $M_G-$ of the example, comprises N=3 row conductors $L_{i-}$ ($L_{1-}$, $L_{2-}$, $L_{3-}$), each of them has an end connected to one of the connecting nodes $N_{iA}$ ($N_{1A}$, $N_{2A}$, $N_{3A}$).

Particularly, the operational amplifiers OAi of the second system solving circuit 300 operate as hereinbefore indicated with reference to the virtual ground and have the respective input node INi connected to each row conductor $L_{i+}$ and $L_{i-}$, particularly, at the contact nodes $N_{1A}$, $N_{2A}$, and $N_{3A}$, and therefore operate as virtual ground nodes.

For the circuit in FIG. 5, with reference to the currents $I_{i+}$ ($I_{1+}$, $I_{2+}$, $I_{3+}$), which are in the row conductors of the first crosspoint matrix $M_G+$, the following equations in a compact form are valid:

$$I_{i+}=\Sigma_j V_j G_{ij+} \quad (23)$$

With reference to the currents $I_{i+}$ ($I_{1+}$, $I_{2+}$, $I_{3+}$), flowing in the row conductors of the second crosspoint matrix $M_G-$, the following equations in a compact form are valid:

$$I_{i-}=-\Sigma_j V_j G_{ij-} \quad (24)$$

The currents $I_{i+}$ and $I_{i-}$ are summed to each other in the respective connecting nodes $N_{1A}$, $N_{2A}$, and $N_{3A}$, according to the Kirchhoff law, for obtaining:

$$Ii=Ii++Ii- \quad (25)$$

Consequently, the current vector I can be expressed by an algebraic notation as:

$$I=GV \quad (26)$$

wherein:

$$Gij=Gij+-Gij- \quad (27)$$

The current vector I is transformed in a voltage vector V by the trans-impedance operational amplifiers OAi and by the respective inverters Invi:

$$V=I/G_{TIA} \quad (28)$$

wherein, as for the hereinbefore described circuit of FIG. 4, $G_{TIA}$ is the conductance of the feedback resistor:

$$G_{TIA} = \lambda G_0 \quad (29)$$

By considering the relationship $Ax=\lambda x$ and comparing it with the relationship (29), it is obtained:

$$A = G/G_0, x = V \quad (30)$$

analogously to the equation (21) of the circuit in FIG. 4.

It is observed that each operational amplifier AOi of the first eigenvector calculating circuit 400 is an active circuit with its own positive and negative supplies. In the row and column conductors of the first eigenvector calculating circuit 400, currents/voltages are generated in order to meet the Ohm and Kirchhoff laws, which determine the solution of the problem. An analogous consideration is valid for the circuits of the other shown figures.

Further Embodiments

It is observed that the conductance values Gij of all the above described circuits, can be obtained not only by using resistive memories (in other words memristors) but by using, for each value of the required conductance Gij, a resistive element (preferably a reconfigurable one) having three or more terminals such as, for example: a field-effect transistor, a floating-gate transistor, a flash memory, a charge-trapping memory. For example, as charge-trapping memory, a device having a metal-oxide-nitride-oxide-semiconductor (MONOS) structure can be used.

Figure 6:
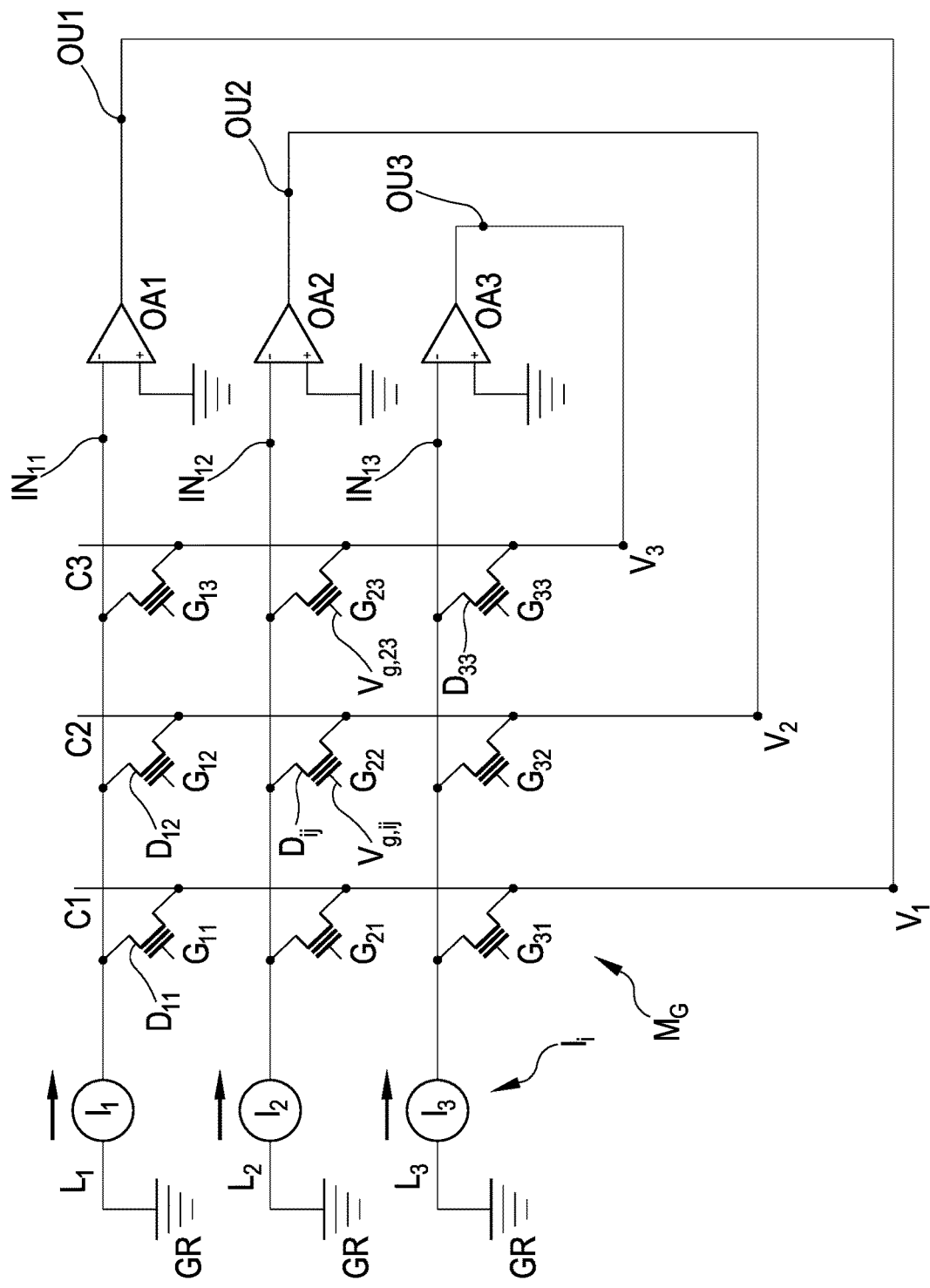
FIG. 6 shows the first circuit for solving square systems of equations in an embodiment using three-terminal resistive elements.

For this purpose, FIG. 6 shows a first embodiment (200A) of the first circuit for solving square systems of equations 200, hereinbefore described with reference to FIG. 2, wherein the conductances Gij are obtained by respective MONOS-type devices Dij.

The gate voltages Vg,ij of each device Dij are controlled by respective tension generators (not shown), and can be partially short-circuited to each other for limiting the number of connections, for example by connecting all the gate terminals of a column, or of a row, to the voltage generator itself. The same circuit in FIG. 6 can be used with floating-gate transistors, or with simple field-effect transistors, or with other types of three terminal elements.

Figure 7:
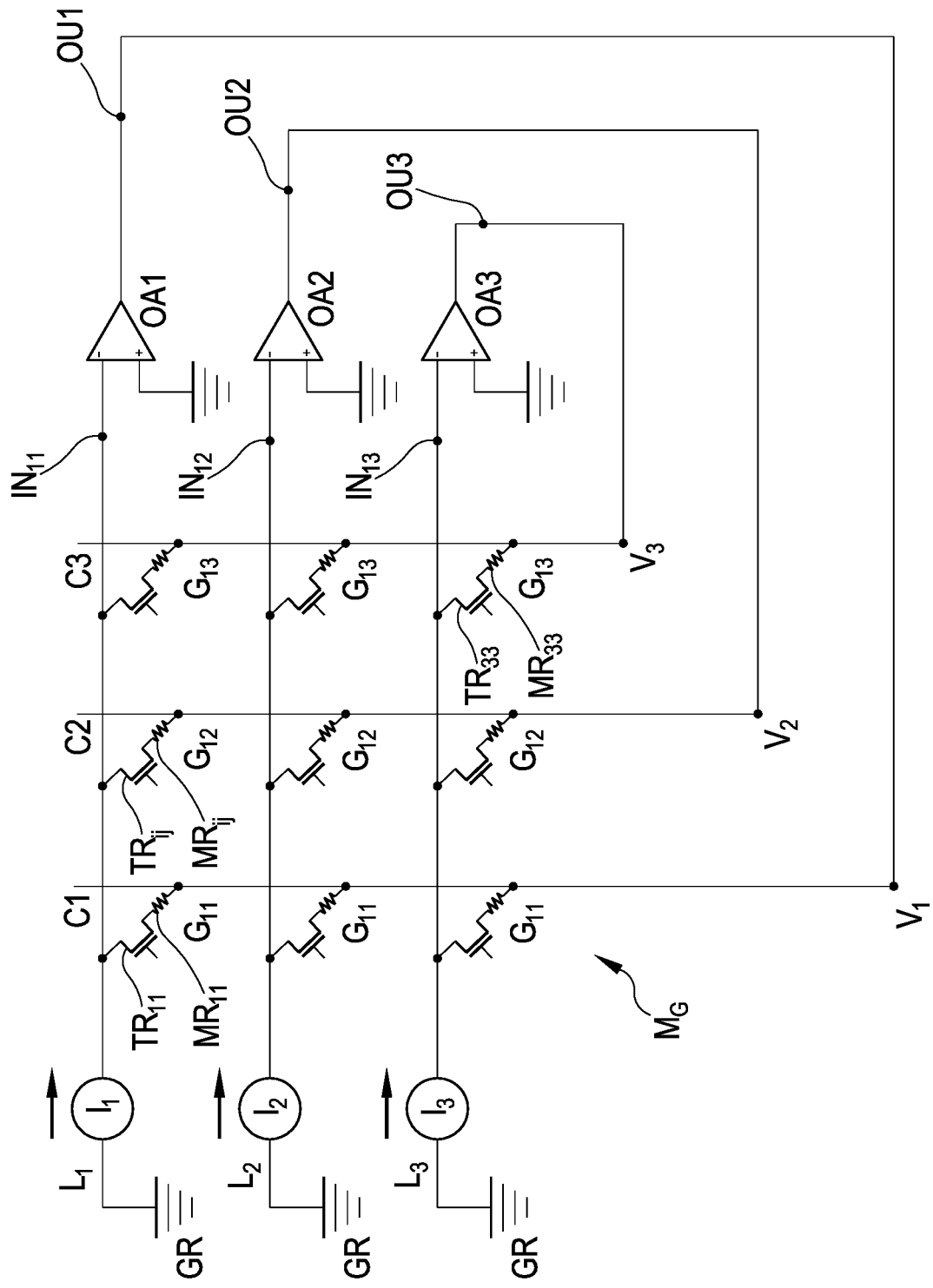
FIG. 7 shows the first circuit for solving square systems of equations in an embodiment using three-terminal resistive elements combined with resistive memories.

Moreover, it is observed that the three terminal resistive element can also comprise a suitable combination of a two terminal element (for example, a memristor) and of a three terminal element. FIG. 7 exemplifyingly shows a second embodiment (200B) of the first circuit for solving square systems of equations 200, wherein each conductance Gij is obtained by suitably configuring a three terminal element comprising a transistor device TRij and a memristor device MRij.

It is useful to observe that what is described with reference to possible resistive elements useable for obtaining conductance values Gij is still valid for the conductance value G0 described with reference to the first eigenvector calculating circuit 400.

Further, it is observed that all the described embodiments can operate by using constant conductance resistive elements, in other words non-reconfigurable elements.

Now it is made reference to the closed-loop configuration of the operational amplifiers OAi in the above described different embodiments. According to a further embodiment, it is also provided that one of the operational amplifiers OAi is in an open-loop configuration wherein the output terminal OUi is not connected to the column conductors Ci.

Figure 8:
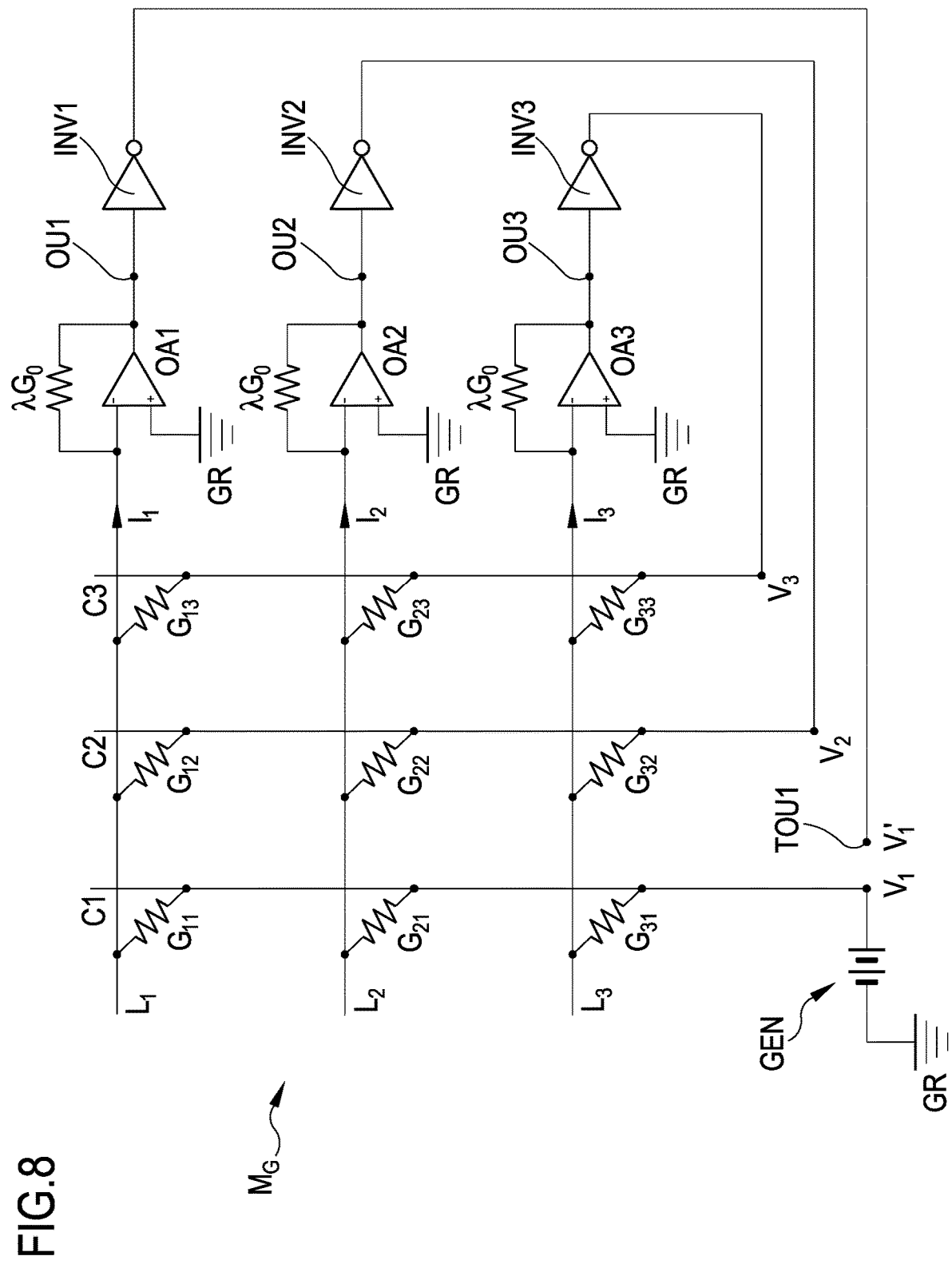
FIG. 8 shows the first circuit for calculating eigenvectors in an embodiment comprising an open-loop operational amplifier.

For example, FIG. 8 shows a different embodiment (400B) of the first eigenvector calculating circuit 400, wherein the output terminal OU1 of the operational amplifier OA1 is not connected to the first column conductor C1 and therefore the voltage to be measured V1' (as an element of the sought eigenvector V) is available at a terminal TOU1 driven by the operational amplifier OA1 (by the respective inverting device Inv1). According to the example of FIG. 8, the first column C1 is supplied by a voltage V1 generated by a voltage generator GEN. There is also the possibility the first column conductor C1 is open, as an alternative or in addition to what shown in FIG. 8, in other points inside the crosspoint matrix $M_G$.

It is observed, as already said, that an application of the mathematical problem solving circuit 100 and of the above described embodiments thereof consists of analyzing big data, for example calculating the rank page of web pages. Other applications comprise the approximate solution of differential equations, such as for example the Schrödinger equation, and other meteorology, financial, biology problems, etcetera.

The mathematical problem solving circuit 100 and the above described embodiments thereof deliver approximate solutions because there are some uncertainties about the configurable values of the resistive memories. Such approximations are acceptable for the greater part of the applications of the circuit itself.

The mathematical problem solving circuit 100 and the above described embodiments thereof have the advantage of being computationally simple: the computation is done in just one clock without requiring multiplications and additions operations. Therefore, the described circuit operates as an algebraic computational accelerator.

Figure 9:
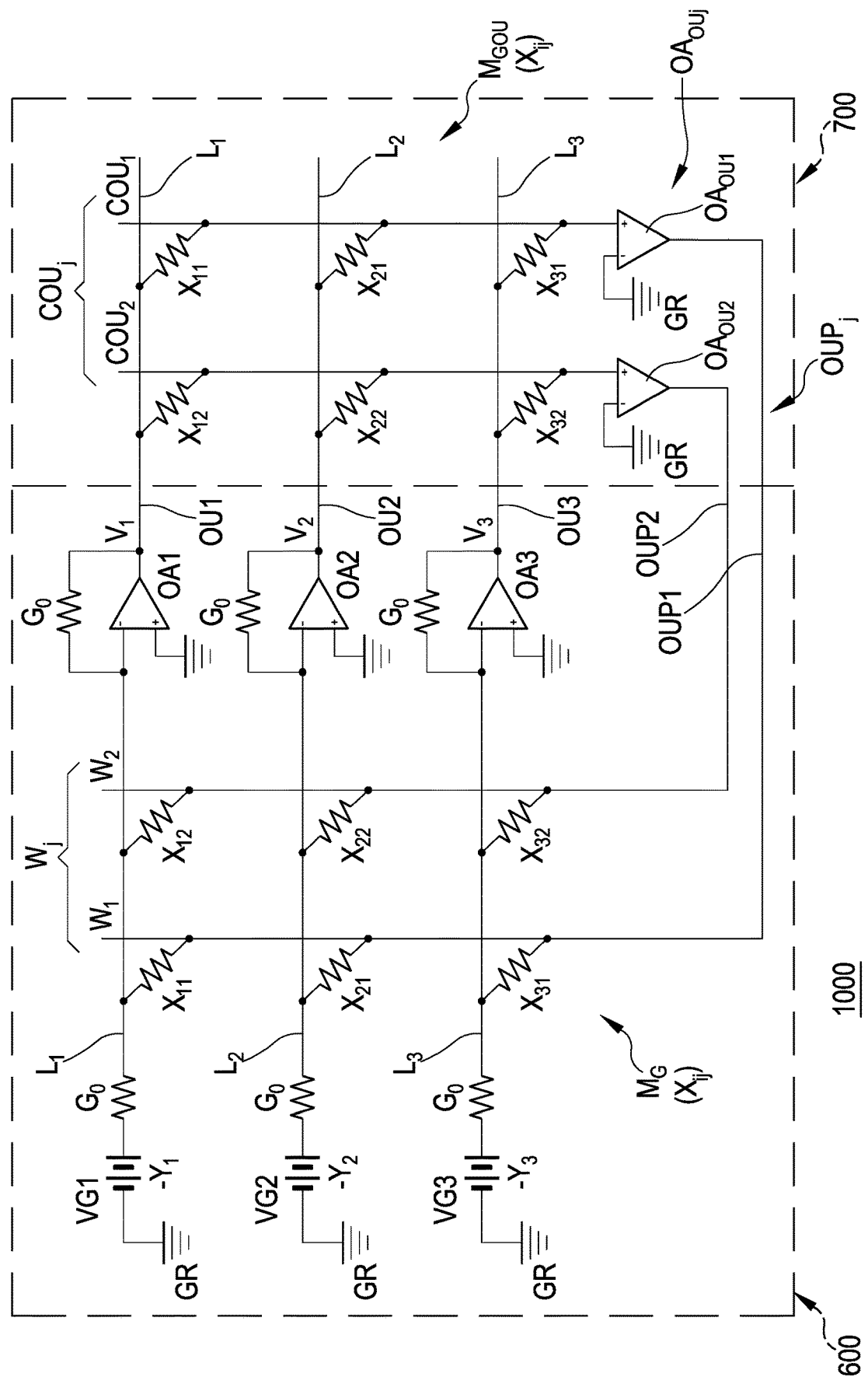
FIG. 9 shows an example of a linear regression accelerator circuit.

FIG. 9 refers to another example of the mathematical problem solving circuit, as a linear regression accelerator circuit 1000.

The linear regression accelerator circuit 1000 comprises a first circuit 600 (or input circuit) connected to a second circuit 700 (or output circuit).

The first circuit 600 is analogous to the mathematical problem solving circuit 100 described in FIG. 1, expect for the fact that the plurality of analog resistive memories is indicated by reference Xij, instead of Gij. The second input circuit 700 is also analogous to the mathematical problem solving circuit 100 described in FIG. 1.

More particularly, the operational amplifiers OAi of the first circuit 600 have a trans-impedance configuration and, specifically, the first input terminal IN1i (the inverting one "−") is connected to the output terminal OUi of each operational amplifier OAi by a respective feedback resistor having a conductance equal to $G_0$, wherein $G_0$ is a known value and is a reference conductance.

The output terminal OUi of each operational amplifier OAi is connected to the second circuit 700 comprising an output crosspoint matrix $M_{Gou}$. The output crosspoint matrix $M_{Gou}$ has the same dimensions of the crosspoint matrix $M_G$ and includes analog resistive memories Xij having values and circuit position identical to the ones of the crosspoint matrix $M_G$ of the first circuit 600.

In the example of FIG. 9, the crosspoint matrix $M_G$ and the output crosspoint matrix $M_{Gou}$ are rectangular matrix. Particularly, the number of columns is less (for example, by a unit) than the number of rows.

The output terminal OUi of each operational amplifier OAi of the first circuit 600 is connected to a respective row conductor Li of the output crosspoint matrix $M_{Gou}$. Each column conductor Couj of the output crosspoint matrix $M_{Gou}$ is connected to a respective output operational amplifier OAoui. Each output operational amplifier OAoui has a respective non-inverting input terminal "+" connected to a respective column conductor Couj and a respective inverting input terminal "−" connected to ground GR.

Each output operational amplifier OAoui is provided with a respective output terminal OUPj connected to a respective column conductor Cj of the crosspoint matrix $M_G$ of the first circuit 600. Each output operational amplifier OAoui is connected in the closed-loop circuit 1000.

Moreover, the linear regression acceleration circuit 1000 is supplied, in the example, by voltage generators VGi each connected to a row conductor Li of the crosspoint matrix $M_G$ and having voltages −yi at a respective terminal to which the conductance $G_0$ is connected. The voltages at the output terminals OUi of each operational amplifier AOi are indicated by reference Vi. The voltages at the output terminals OUPj of the output operational amplifiers OAoui are indicated by the symbols wj (in the example w1 and w2).

With reference to the linear regression problem, it is remembered that the regression formalizes and solves the problem of a functional relationship between measured variables based on sampled date extracted from an infinite hypothetical population. For example, it m points (input-output pairs are considered), each with n input variables:

$$(x_1, x_2, \ldots, x_n) \quad (31)$$

and an output coordinate y.

For an i-th input-output pair, there is the linear regression relationships:

$$y_i = w_0 + w_1 x_1^i + w_2 x_2^i + \ldots + w_n x_n^i + \varepsilon_i \quad (32)$$

wherein i covers all the integers from 1 to m.

By expressing the whole in a matrix form, it is obtained:

$$y = X \cdot w + \varepsilon \quad (33)$$

wherein: W is the matrix of the coefficients (to be determined), and ε is the approximation error:

$$y = \begin{bmatrix} y_1 \\ y_2 \\ \vdots \\ y_m \end{bmatrix} \quad X = \begin{bmatrix} 1 & x_1^1 & \ldots & x_n^1 \\ 1 & x_1^2 & \ldots & x_n^2 \\ \vdots & \vdots & \ddots & \vdots \\ 1 & x_1^m & \ldots & x_n^m \end{bmatrix} \quad w = \begin{bmatrix} w_0 \\ w_1 \\ \vdots \\ w_n \end{bmatrix} \quad \varepsilon = \begin{bmatrix} \varepsilon_1 \\ \varepsilon_2 \\ \vdots \\ \varepsilon_m \end{bmatrix}$$

In order to minimize the approximation error ε, the norm of the vector ε is minimized, therefore is expressed by:

$$\|\varepsilon\|^2 = (y - X \cdot w)^T (y - X \cdot w) \quad (34)$$

The minimum of the norm can be determined by setting to zero the derivative of the expression (34) with respect to the variable w:

$$\frac{\partial \|\varepsilon\|^2}{\partial w} = \frac{\partial}{\partial w}(y - X \cdot w)^T(y - X \cdot w)$$
$$= -2X^T y + 2X^T X w = 0$$

It follows that:

$$X^T X w = X^T y \quad (35)$$

Therefore, the matrix of the coefficients w is given by:

$$w = (X^T X)^{-1} X^T y \quad (36)$$

wherein $(X^T X)^{-1} X^T$ is the pseudo-inverse of the matrix X.

Referring again to the linear regression circuit 1000, it is useable for minimizing the quadratic error (34), by solving the expression (36).

Indeed, the output voltages Vi (vector V) of the operational amplifiers OAi (which are made to operate in a trans-impedance configuration) can be expressed by the following relationship:

$$V = -(X \cdot w - G_0 y)/G_0 \quad (37)$$

wherein X is the matrix of the conductances Xij and $G_0$ was defined before.

The output operational amplifiers OAouj, analogously to what described with reference to the operational amplifiers OAi, are configured to connect the respective non-inverting input terminal to the virtual ground, and therefore:

$$X^T \cdot V = -X^T \cdot (X \cdot w - G_0 y)/G_0 = 0 \quad (38)$$

The matrix $G_0$ is the unit for the matrix of the conductances X and therefore the expression (38) takes the form:

$$X^T X \cdot w - X^T y = 0 \quad (39)$$

which is equivalent to the equation (36).

After correctly dimensioning the circuit 1000 based on known values and once applied the supply voltage by the voltage generators VGi, the circuit 1000 will operate so that the output terminals of the output operational amplifiers OAouj have respective voltages wj representing the sought solution (as from the expression (36)). Analogously to what was done for the previous embodiments, also for the linear regression accelerator circuit 1000, the computation is performed in only one clock without requiring multiplying and summing operations. Therefore, the described linear regression circuit 1000 operates as an algebraic computational accelerator.

The arrangement of the linear regression accelerator circuit 1000 hereinbefore described is also adaptable to be used as a logistic regression accelerator. As it is known, the logistic regression is a particular case regarding the cases wherein the y-dependent variable is of a dichotomic type tied to a low value (for example −1) and a high value (for example +1), as all the variables which can only take two values (for example: true or false).

For implementing the logistic regression accelerator, it is provided to modify the layout of the circuit 1000 of FIG. 9 with voltage (or current) supply generators representing dichotomic values −1 (for the low value) and 1 (for the high value). The obtained vector w identifies the coefficient of the equation (32) enabling to linearly separate the two classes of points with high and low y.

Moreover, the linear regression accelerator circuit 1000 is useable for calculating the coefficient wj of a neural network, this prevents to perform the iterative training, for example according to the back-propagation method.

Figure 10:
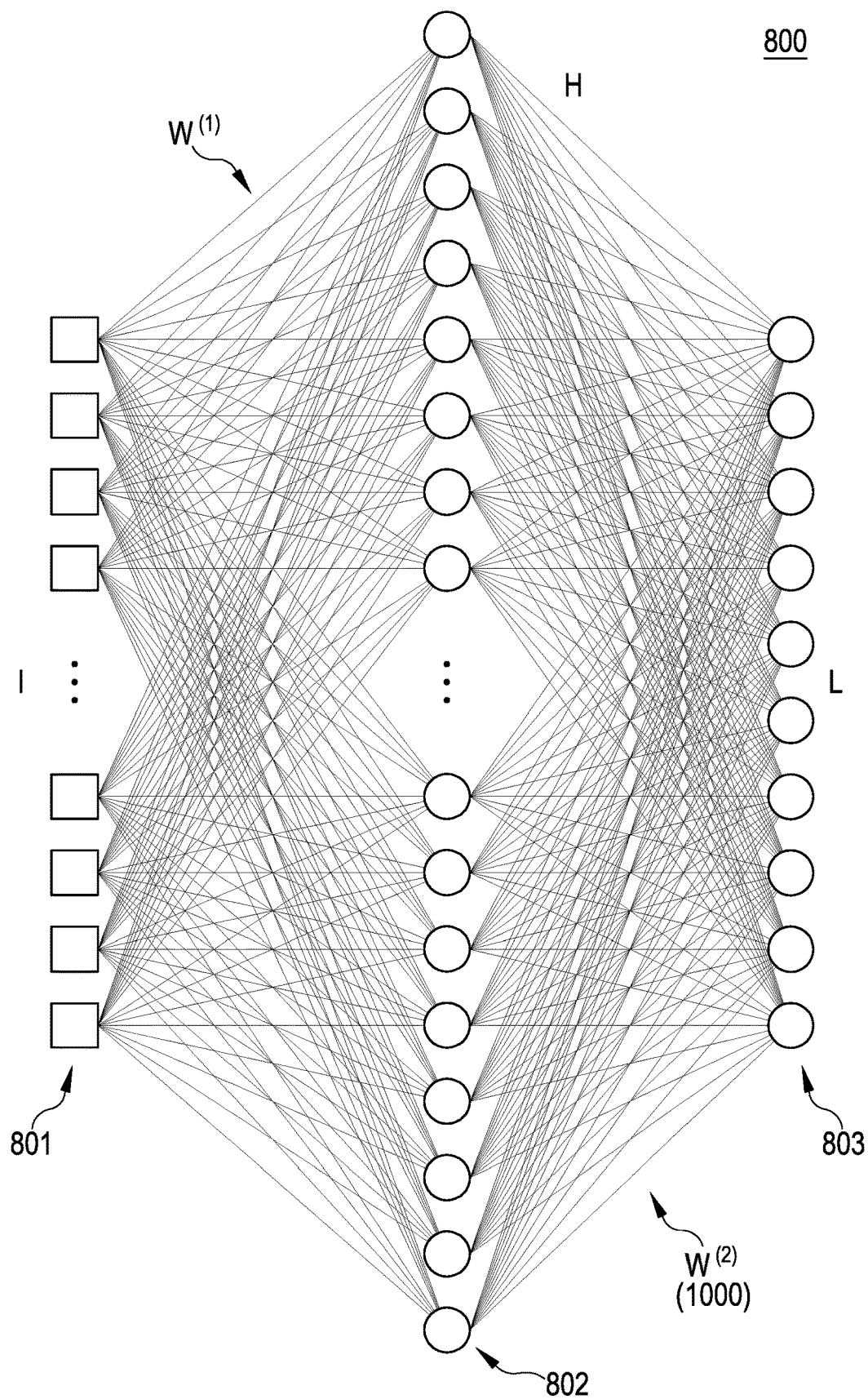
FIG. 10 shows an example of a neural network which is trained by using a linear regression accelerator circuit.

For example, FIG. 10 schematically shows a neural network 800 comprising an inlet layer 801, and a hidden layer 802 and an outlet layer 803.

In the example of FIG. 10, the inlet layer comprises $N_1 = 14 \times 14 = 196$ neurons, the hidden layer comprises $N_2 = 784$ neurons, and lastly the output or classifying layer comprises $N_3 = 10$ neurons.

The weights of the neural network 800, associated to the input layer 801 can be represented by a matrix $W^{(1)}$ (for example, $W^{(1)}$ with dimensions $N_1 \times N_2 = 196 \times 784$) while the weights associated to the hidden layer 804 can be represented by a matrix $W^{(2)}$ (for example, $W^{(2)}$ with dimensions $N_2 \times N_3 = 784 \times 10$).

The neural network 800 is useable, for example, for acknowledging/classifying the input quantities. According to a particular example, a network as the above described one can be used for acknowledging hand-written numbers (from 0 to 9). For example, a single digit in the MNIST data-set standard represented in a matrix of $N_1$ input values (pixel) can be classified by the neural network as a digit from 0 to 9 by suitably training the network 800 for setting the values of the synaptic weights.

It is observed that the operation of training the neural network 800 is a logistic regression operation, wherein the weights represent the coefficients which better linearly separate the dichotomic output of the neurons.

Consequently, the network can be trained by the linear regression circuit 1000 in FIG. 9, operated according to the previously described logistic regression algorithm. For this purpose, the synaptic weights $W^{(1)}$ between the first neuron layer 801 and the hidden neuron layer 802 are arbitrarily set, for example, according to a weight random distribution. Moreover, it is used a training data-set formed by a determined number M of sets of $N_1$ input values to be presented to the neurons of the first layer 801. The matrix X to be used inside the circuit 1000 will then be formed by output values of the hidden network on different M presentations.

By defining the matrix I containing all the M*N presented input values, the matrix I is for example obtained as:

$$X = \text{sigmoid}(I*W^{(1)}) \quad (40)$$

wherein the sigmoid function is a possible nonlinear function associated to a generic neuron. It is observed that the matrix has dimensions $M*N_2$. The vector $y_i$ in FIG. 9 is on the contrary obtained as a matrix of labels (+1 for label "true" and −1 for label "false"), referred to the i-th classification neuron (for i varying from 1 to $N_3$). The synaptic weights referred to the i-th neuron are therefore obtained by the linear regression:

$$W_i^{(2)} = (X^T X)^{-1} X^T y \quad (41)$$

Therefore, the values of the weights $W^{(2)}$ of the hidden layer 802 can be obtained by using the linear regression accelerator circuit 1000, by observing that the matrix expression (41) is analogous to the above discussed matrix expression (36). It is observed that the operation must be repeated $N_3$ times, one for each classification neuron. Each operation enables to obtain the $N_2$ synaptic weights referring to the i-th output neuron. In this way, the repetitive operations enable to obtain all the $N_2 \times N_3$ synaptic weights $W^{(2)}$ between the hidden layer and the output layer.

It is observed that the linear regression accelerator 1000 and the above described particular embodiments thereof are very useful in the data science and find possible applications in different scientific and engineering fields such as, for example in: economy, finance, biology, physics, automatic training, robotics.

The invention claimed is:

1. A mathematical problem solving circuit, comprising:
   a crosspoint matrix ($M_G$; $M_G$ou) including a plurality of row conductors ($L_i$), a plurality of column conductors ($C_j$; $C_{ouj}$) and a plurality of resistive elements (Gij; Xij) each connected between a row conductor and column conductor; and
   a plurality of operational amplifiers ($OA_i$; OAouj), each having: a first input terminal (IN1$i$; "+") connected to a respective row conductor ($L_i$), a second input terminal (IN2$i$; "−") connected to a ground terminal (GR) and an output terminal (OUi; OUPj) connected to a respective column; each operational amplifier ($OA_i$; OAouj) of the plurality is in closed-loop configuration and comprises a respective output terminal (OUi; OUPj) connected to a respective column conductor ($C_j$; $C_{ouj}$) which is connected to the respective row conductor to perform the closed-loop configuration and being such to bring the respective first input terminal (IN1$i$; "+") towards a virtual ground;
   wherein:
   the plurality of resistive elements represents, by respective conductance values (Gij; Xij), a first plurality of known values of a mathematical problem;
   at least one configurable electric quantity (Ii; λG0; Go) for representing at least one second known value of the mathematical problem is associated with the circuit; and
   the plurality of operational amplifiers (OAi; OAouj) defining from the respective output terminals a plurality of output voltages ($V_i$; wi) representative of a plurality of solution values of the mathematical problem; the circuit is configured so as that the plurality of output voltages ($V_i$; wi) representative of the plurality of solution values are assumed when said first input terminals (IN1$i$; "+") assume the virtual ground.

2. The mathematical problem solving circuit according to claim 1, wherein the plurality of resistive elements includes at least one device belonging to the group: resistive memory, three-terminal resistive element (Dij, TRij), a combination of a resistive memory (MRij) and a three-terminal resistive element (TRij).

3. The mathematical problem solving circuit according to claim 1, wherein said at least one second known value comprises a second plurality of known values, the circuit further comprising a plurality of current generators ($I_i$) each connected to a row conductor ($L_i$) of said plurality of row conductors and configured to generate an electric current corresponding to a known value of the second plurality.

4. The mathematical problem solving circuit according to claim 3, wherein the circuit is configured for solving a square system of equations expressible by the following matrix form:

$$Ax = b$$

wherein:
   A is a matrix of known elements and said conductance values of the crosspoint matrix ($M_G$) are related to said known elements of said matrix A;
   b is a vector of known elements and said plurality of current generators ($I_i$) are configured so that each current generator generates an electric current corresponding to a known element of said vector b; and
   x is a vector of unknown elements and the plurality of output voltages (Vi) represent said unknown elements.

5. The mathematical problem solving circuit according to claim 1, wherein the first input terminal (IN1$i$) of each operational amplifier (OAi) is an inverting terminal, and wherein the second input terminal (IN2$i$) of each operational amplifier (OAi) is a non-inverting terminal.

6. The mathematical problem solving circuit according to claim 1, configured to solve a mathematical problem belonging to a group: a square system of equations expressible in a matrix form; inversion of real square matrixes; calculation of eigenvectors; solution of differential equations.

7. The mathematical problem solving circuit according to claim 6, wherein the circuit is configured for determining an inverse matrix $A^{-1}$ of a square matrix A to be inverted, according to the system of equations:

$$AA^{-1} = U$$

wherein:
the matrix A to be inverted contains known elements and said conductance values of the crosspoint matrix ($M_G$) are related to said known elements;
U is the identity matrix and said plurality of current generators ($I_i$) are configured in order to generate electric currents of values corresponding to values of a vector of the identity matrix U; and
the inverse matrix $A^{-1}$ comprises a plurality of vectors of unknown elements and the plurality of output voltages (Vi) represent one of said vectors of unknown elements of the inverse matrix $A^{-1}$.

8. The mathematical problem solving circuit according to claim 6, wherein the circuit is configured to solve an eigenvector and eigenvalue problem of a square matrix expressible by the relation:

$$Ax=\lambda x$$

wherein:
A is a square matrix containing respective known elements and said conductance values of the crosspoint matrix ($M_G$) are related to said known elements of the square matrix A;
$\lambda$ is a known eigenvalue related to the conductance value of said trans-impedance resistor ($\lambda G_0$); and
x is an unknown eigenvector and the plurality of output voltages ($V_i$) represent said unknown eigenvector.

9. The mathematical problem solving circuit according to claim 1, wherein said plurality of resistive elements of the crosspoint matrix (MG+) is configured to represent, by the respective conductance values ($G_{ij+}$), the first plurality of known values wherein such known values of the first plurality are positive values.

10. The mathematical problem solving circuit according to claim 9, further comprising: a further crosspoint matrix ($M_G$) including a further plurality of row conductors ($L_i$),
a further plurality of resistive elements ($G_{ij-}$) each connected between a row conductor ($L_i$) of the further plurality of row conductors and a respective column conductor of said plurality of column conductors (Cj); the further crosspoint matrix is configured to represent, by the respective conductance values ($G_{ij-}$), absolute values of a second plurality of known negative values regarding the mathematical problem; and
a plurality of voltage inverters (Inv1, Inv2, Inv3) each disposed on a respective column conductor ($C_i$) and interposed between the crosspoint matrix and the further crosspoint matrix; wherein:
each row conductor of the further plurality of row conductors ($L_{i-}$) is connected to the first input terminal (IN1$i$) of a respective operational amplifier (OAi) for assuming the virtual ground.

11. The mathematical problem solving circuit according to claim 1, wherein the operational amplifiers (OAi) have a trans-impedance configuration and each comprises a feedback resistor ($\lambda G_0$) disposed between the respective output terminal (OUi) and the first input terminal (INi), the feedback resistor having a conductance value related to said at least one second known value.

12. The mathematical problem solving circuit according to claim 1, wherein the circuit is configured to be supplied by a constant or pulsed electric current.

13. The mathematical problem solving circuit according to claim 1, wherein the circuit comprises at least one device for measuring the plurality of output voltages (Vi).

14. The mathematical problem solving circuit according to claim 1, comprising a input computing circuit and a output computing circuit; the input computing circuit comprising:
an input crosspoint matrix ($M_G$) including a plurality of input row conductors ($L_i$), a plurality of input column conductors ($C_j$) and a plurality of input resistive elements (Xij) each connected between an input row conductor and input column conductor;
a plurality of input operational amplifiers ($OA_i$) each of them in trans-impedance configuration, each having: a respective first input terminal (IN1$i$) connected to a respective row conductor ($L_i$), a respective second input terminal (IN2$i$) connected to a ground terminal (GR) and a respective output terminal (OUi; OUPj); the plurality of input operational amplifiers ($OA_i$) being such to bring the respective first input terminal (IN1$i$) towards a virtual ground;
and wherein the output computing circuit comprises:
said crosspoint matrix ($M_{Gou}$) and the plurality of operational amplifiers (OAouj); the plurality of input operational amplifiers ($OA_i$) having respective output terminal (OUi) connected to said row conductors of the crosspoint matrix ($M_{Gou}$); and
the operational amplifiers (OAouj) having the first input terminals ("+") connected to corresponding column conductors ($C_{ouj}$) of the crosspoint matrix ($M_{Gou}$) and first output terminal (OUPj) connected to corresponding input column conductors (Cj) of the input crosspoint matrix ($M_G$).

15. The mathematical problem solving circuit according to claim 1 wherein said circuit is configured to operate in accordance to one of the following mode: linear regression accelerator; logistic regression accelerator.

* * * * *